United States Patent [19]
Okazaki

[11] Patent Number: 6,019,501
[45] Date of Patent: *Feb. 1, 2000

[54] ADDRESS GENERATING DEVICE FOR MEMORY TESTER

[75] Inventor: Tadashi Okazaki, Gyoda, Japan

[73] Assignee: Advantest Corporation, Tokyo, Japan

[ * ] Notice: This patent is subject to a terminal disclaimer.

[21] Appl. No.: 07/860,017

[22] Filed: Mar. 30, 1992

[30] Foreign Application Priority Data

Mar. 29, 1991 [JP] Japan ................................. 3-066691

[51] Int. Cl.[7] ..................................................... G11C 29/00
[52] U.S. Cl. ............................. 371/21.1; 371/27; 371/24
[58] Field of Search ........................... 371/24, 21.1, 21.2, 371/21.3, 25.1, 27

[56] References Cited

U.S. PATENT DOCUMENTS

| | | | |
|---|---|---|---|
| 4,293,950 | 10/1981 | Shimizu et al. | 371/27 |
| 4,300,234 | 11/1981 | Maruyama et al. | 371/27 |
| 4,555,663 | 11/1985 | Shimizu | 371/27 |
| 4,631,724 | 12/1986 | Shimizu | 371/27 |
| 4,701,918 | 10/1987 | Nakajima et al. | 371/22.1 |
| 4,701,919 | 10/1987 | Maitoh et al. | 371/27 |
| 4,754,424 | 6/1988 | Watanabe | 371/27 |

*Primary Examiner*—Robert W. Beausoliel, Jr.
*Assistant Examiner*—Phillip F. Vales
*Attorney, Agent, or Firm*—Staas & Halsey

[57] ABSTRACT

In an address generating device wherein addresses are generated by an address computation part in response to data and control signals read out of an instruction memory and are provided to a memory under test, a command control bit for storing a command control signal is provided in the instruction memory and a command register is provided for storing a command read out of a data area of the instruction memory. The output from the address computation part and the output from the command register are input into a first multiplexer, which selects either one of the two inputs in response to a command control signal read out of the command control bit. The output from the first multiplexer is applied to a descrambler, wherein it is translated to a physical address. A second multiplexer is provided for selecting either one of the outputs from the descrambler and the first multiplexer in such an instance. The second multiplexer is controlled by a descramble inhibit signal read out of a descramble inhibit bit in the instruction memory.

3 Claims, 4 Drawing Sheets

ADDRESS GENERATING DEVICE FOR MEMORY TESTER

BACKGROUND OF THE INVENTION

The present invention relates to a memory tester for testing, for example, memories fabricated as semiconductor integrated circuits and, more particularly, to an address generating device for use in such a memory tester.

Figure 1:
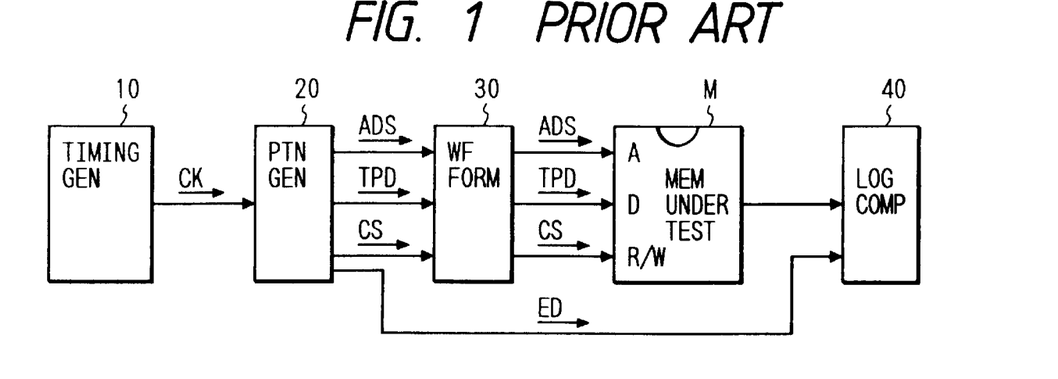
FIG. 1 is a block diagram of a conventional memory tester to high the address generating device of the present invention is applied.

FIG. 1 shows the basic construction of a conventional memory tester in its entirety. The memory tester comprises a timing generation part 10, a pattern generator 20, a waveform formatter 30 and a logical comparison part 40 and tests a memory M. The parts 10, 20, 30 and 40 are connected to a central processing unit (i.e. a computer) (not shown) via a system bus to conduct an initialization for test and to make an analysis of test results. Based on a reference clock CK available from the timing generation part 10, the pattern generator 20 generates an address signal ADS, test pattern data TPD and a control signal CS which will ultimately be applied to the memory under test M. The address signal ADS, the test pattern data TPD and the control signal CS are provided to the waveform formatter 30.

The waveform formatter 30 derives from the test pattern data TPD a test pattern signal which has a waveform necessary for test, and applies the test pattern signal TPD to the memory under test M together with the address signal ADS and the control signal CS. The memory under test M is placed under control of the control signal CS for write and read of the test pattern signal. The logical comparison part 40 compares expected value data ED from the pattern generator 20 and data read out of the memory under test M and determines if the memory under test M is non-defective, depending on wether the both pieces of data match.

Figure 2:
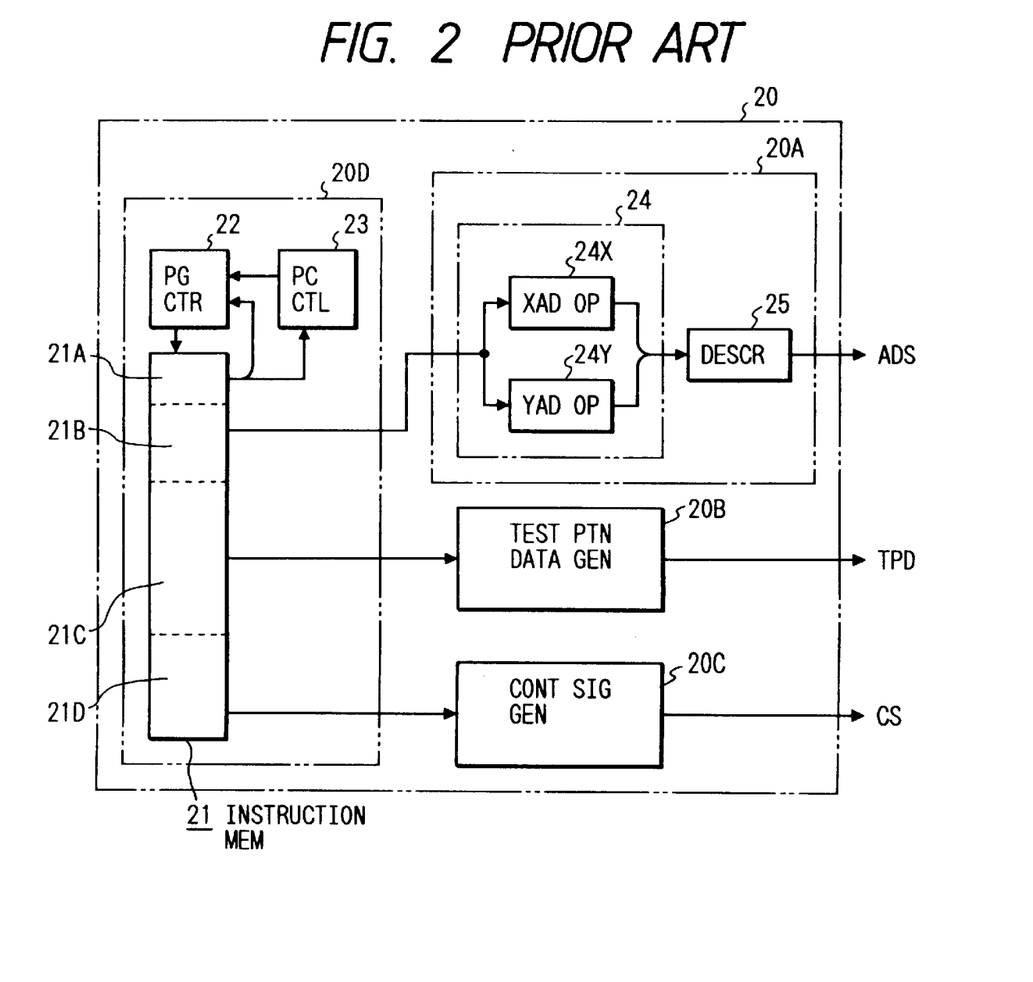
FIG. 2 is a block diagram illustrating the construction of a pattern generator 20 in FIG. 1.

FIG. 2 shows the internal construction of the pattern generator 20, which is made up of an address generation part 20A, a test pattern data generation part 20B, a control signal generation part 20C and a sequence control part 20D for controlling the parts 20A through 20C.

The sequence control part 20D is comprised of an instruction memory 21 wherein there is stored a program composed of a series of instructions for controlling the sequence of memory testing, a program counter 22 for specifying an address of the memory 21 to be read out and a program counter controller 23 for controlling the program counter 22 on the basis of an instruction code read out of the memory 21. The memory area of each address in the instruction memory 21 includes an instruction code area 21A wherein an instruction code for controlling the program sequence is written, an address computation instruction area 21B wherein an address computation instruction is written, a data computation instruction area 21C wherein a data computation instruction is written, and a timing data area 21D wherein timing data for generating the control signal CS is written.

The output of the program counter 22 is provided as an address to the instruction memory 21, from which contents stored in the areas 21A, 21B, 21C and 21D of the address are simultaneously read out and provided to the program counter controller 23, the address generation part 20A, the test pattern data generation part 20B and the control signal generation part 20D. The program counter controller 23 decodes the instruction code read out of the instruction code area 21A and increments, decrements or holds the program counter 22, or loads therein the read-out address value.

The address generation part 20A has an address computation part 24 composed of an X address computation part 24X and a Y address computation part 24Y and responds to the address computation instruction read out of the address computation instruction area 21B of the instruction memory 21 to create an X address and a Y address through computation in the X address computation part 24X and the Y address computation part 24Y, respectively. The test pattern data generation part 20B and the control signal generation part 20C also operate in about the same manner as does the address generation part 20A and respond to the instructions read out of the data computation instruction area 21C and the timing data area 21D to generate the test pattern data TPD and the control signal CS. The pattern generator 20 of such a construction is disclosed in U.S. Pat. No. 4,797,886, for instance.

An address descrambler 25 converts address viewed from the outside of the semiconductor memory under test M (which address will hereinafter be referred to a logical address) to the corresponding address in the actual memory cell configuration (which address will hereinafter be referred to as a physical address). The address descrambler 25 is formed by a memory which has a translation table. Prior to a memory test a translation table for the memory under test M is loaded in the address descrambler 25 via a system bus (not shown). In the memory test the logical address produced by the address computation part 24 is provided as a read address to the descrambler 25 to read out therefrom the corresponding physical address.

Figure 3:
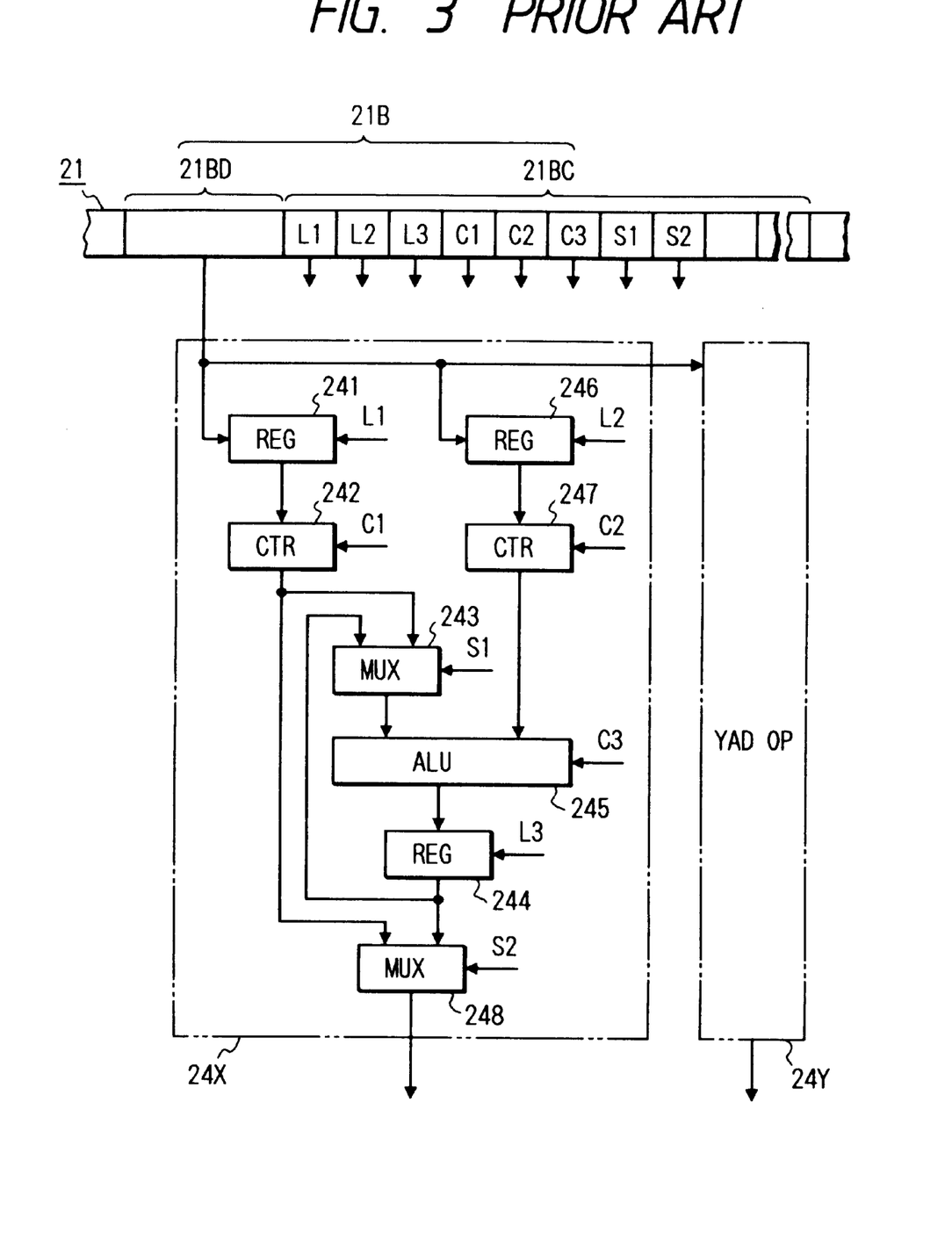
FIG. 3 is a block diagram showing a part of an instruction memory and an address generating device composed of X an Y address computation parts in FIG. 2.

FIG. 3 shows in more detail the internal construction of the address computation part 24 and the address computation instruction area 21B of the instruction memory 21 in a memory tester already put on the market. The address computation instruction area 21B comprises a data area 21BD wherein data for an address computation and command data described later on are described and a control signal area 21BC including control bits as signed to various control signals for controlling the execution of the address computation. The X address computation part 24X has such a construction as described below. A start address register 241 holds an initial value of the X address. A counter 242 responds to a preset control signal C1 to preset the contents of the start address register 241 and increments, decrements or holds the preset contents in response to an address computation control signal (1). A multiplexer 243 responds to a selection control signal S1 in the address computation instruction to provide the contents of either one of the counter 242 and a current register 244 to the one input of an arithmetic and logic unit 245. A register 246 holds an address shift initial values, which is loaded in a counter 247 in response to a preset control signal C2, and the counter 247 increments, decrements or holds the address shift initial value in response to a computation control signal (2). The contents of the counter 247 are provided to the other input of the arithmetic and logic unit 245. The arithmetic and logic unit 245 responds to an address computation control signal C3 to conduct a computation between the two input, for example, an addition, subtraction, ORing or ANDing, and stores the computed output in the current register 244. A multiplexer 248 responds to a selection control signal S2 in the address computation instruction to output the contents of either one of the counter 242 and the current register 244.

Data, described as a part of a microinstruction program in the data area 21BD in the address computation instruction area 21B of the instruction memory 21, is loaded into the registers 241 and 246 in accordance with load control signals L1 and L2. The operations of the counters 242 and 247, the arithmetic and logic unit 245 and the multiplexers 243 and 248 are controlled by control signals C1, C2, C3 and S1, S2 written in the control signal area 24BC in the address computation instruction area 21B. For example, when the counter 242 is selected by the multiplexer 242 and is incremented one by one, it is possible to obtain an X address pattern which increases one by one from its initial address value. By loading an address shift initial value into the counter 247 and putting it in the holding state, selecting the current register 244 by the multiplexer 243 and conducting an addition in the arithmetic and logic unit 245, an X address pattern is obtained in which the address increases by an address shift value each time. Alternatively, by causing the arithmetic and logic unit 245 to add a proper shift value of the counter 247 to or subtract it from an address specified by the counter 242, it is possible to arbitrarily access a memory cell in the vicinity of a certain cell of the memory under test M. Thus, various address patterns can be generated by appropriately applying control signals to the counters 242, 247, the multiplexers 243, 248 and the arithmetic and logic unit 245.

The Y address computation part 24Y is also identical in construction with the X address computation part 24X. A series of addresses for accessing the memory under test M are generated by the address generation part 20A including such X and Y address computation parts 24X and 24Y, and as is well-known in the art, the memory M is tested in a sequence of address patterns different for each different purpose of the test. The generation of such address patterns is disclosed in, for instance, U.S. Pat. No. 4,402,081.

In recent years, a flash memory has attracted attention as an nonvolatile memory which has a large-capacity and is capable of rewriting a number of times. The flash memory has a plurality of modes of operation such as read/write operation of data, an erasure of all of the data stored therein block by block, etc. These modes of operation are each selected by inputting a specific command into a controller in the memory from the outside. A terminal for inputting the command is not a dedicated terminal but is used also as an address terminal. The input to the terminal is switched between the address and the command by, for example, changing the logic of a control signal that is applied to a specific terminal of the flash memory.

In the test of such a memory M the command for controlling its mode of operation must be provided from the data area 21BD of the instruction memory 21 via a conventional address computation part 24X (or 24Y) shown in FIG. 3. In the prior art, for example, command data in the area 21BD is set in the register 246 and its value is loaded in the counter 247, after which the multiplexer 243 is put in a non-select state (providing no output) and the command data in the counter 247 is set in the current register 244 via the arithmetic and logic unit 245. Moreover, the multiplexer 248 is connected to the current register 244, from which the command data is provided to the memory under test M.

In the case where such an address is switched to the command in the middle of testing the memory M, it is necessary to subsequently return to the address at the point of switching. To perform this, it is necessary to provide a sequence of microinstruction steps in which the value of the counter 247 in a step necessary for switching from the address to the command in an instruction program is preknown, the register 246 is reset to an initial value, then the value is loaded in the counter 247 and the counter 247 is advance one by one to the preknown value.

During the execution of such a sequence of microinstruction steps for resetting the counter 247 to the value at the point of switching between the address and the command, no address is available from the address computation part 24X and the test of the memory M is suspended. That is, the memory M is in a dummy cycle during this time. In the actual use of the memory M, however, its operation does not include such a dummy cycle—this poses a problem that during the test the memory M does not operate in exactly the same way as in the actual use. In addition, it is cumbersome to prepare an instruction program in anticipation of the value of the counter 247 at the time of switching from the address to the command.

In the case of testing a semiconductor memory of the type using one input terminal both as the address input terminal and as the command input terminal as mentioned above, if the semiconductor memory is one that the logical address and the physical address do not always match, a translation table for translating the logical address to the physical address is prestored in the memory forming the address descrambler 25 and the logical address which is output from the address computation part 24 is translated to the physical address by use of the address translation table. This allows ease in the preparation of the microinstruction program for address generation use. It is necessary, however, that the memory tester also be capable of testing a memory of the type in which the logical address and the physical address match. To this end, an enable register and a multiplexer (both not shown) are provided and the output address from the descrambler 25 or the input address thereto is selectively output by the multiplexer in accordance with the contents of the enable register. Prior to the start of the test, an enable signal corresponding to the type of the memory under test M is set in the enable register via a system bus (not shown) and its contents cannot be changed in the course of the test. Hence, when a command for changing the mode of operation of the memory under test M is provided from the address computation part 24 in the middle of the test, the command is also translated by the descrambler 25, and consequently, no correct command can be provided to the memory M.

SUMMARY OF THE INVENTION

It is therefore an object of the present invention to provide an address generating device which overcomes the above-mentioned defects of the prior art, can affect switching between an address and a command which are applied to a memory under test without introducing a dummy cycle so that the memory can be tested under the same conditions as in the actual use thereof during testing of the memory.

Another object of the present invention is to provide an address generating device can supply of a command from an address computation part to a memory under test without any translation of the address caused by an address descrambler even in the middle of the memory the test.

According to a first aspect of the present invention, an instruction memory, wherein there is written, as a program, a sequence of address computation instructions composed of data and control signals for the generation of an address to be provided to a semiconductor memory under test, includes a data area in which to describe data for generating the address by logical computation and data corresponding to a command to be provided to the semiconductor memory under test, a command control bit assigned to a command control signal for controlling the outputting of the command, and a computation control bit assigned to a computation control signal for the logical computation of the address. The readout sequence of the instruction memory is controlled by sequence control part, and address computation part sequentially generates addresses through logical computation in response to the data and the computation control signal read out of the instruction memory. Command storage part is provided for storing commands to be provided to the semiconductor memory under test. In response to the command control signal based on the command control bit, selective output part selectively outputs the output of either one of the address computation part and the command storage part.

With such an address generating device according to the first aspect of the invention, it is possible to switch the mode of operation between the address generation and the command generation without introducing a dummy cycle.

According to a second aspect of the present invention, descramble part for translating the output address from the selective output part of the address generating device into a physical address and multiplexer part for selectively providing the output of either one of the selective output part and the descramble part are provided, and the selective outputting of the multiplexer part is controlled by a select control signal which is read out of the select control bit included in the instruction memory.

With such an address generating device according to the second aspect of the present invention, it is possible to selectively output a command for input into the semiconductor memory under test even in the middle of the generation of an address by the address computation; hence, a semiconductor memory can also be tested which is of the type that physical and logical addresses do not necessarily match.

DESCRIPTION OF THE PREFERRED EMBODIMENTS

Figure 4:
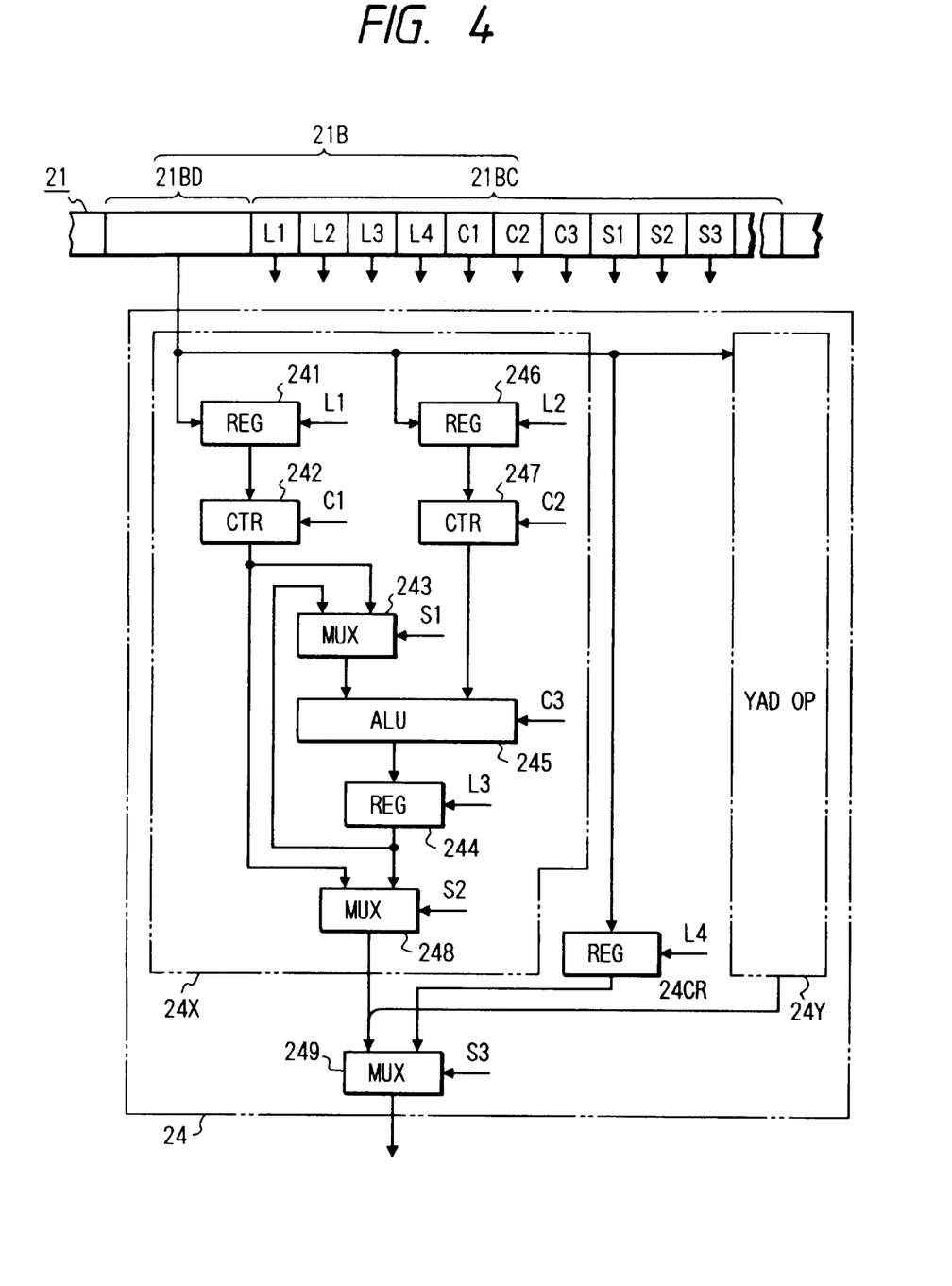
FIG. 4 is a block diagram illustrating an embodiment of the address generating device according to the present invention.

FIG. 4 illustrates in block form an embodiment of the address generating device according to the present invention, in which the parts corresponding to those in FIG. 3 are identified by the same reference numerals. The address generating device of the present invention corresponds to a combination of the areas 21A and 21B of the instruction memory 21, the program counter 22, the program counter controller 23 and the address generation part 20A in FIG. 2, but the program counter 22 and the program counter controller 23 are not shown in the interests of brevity. The X and Y address computation parts 24X and 24Y are identical in construction with those in FIG. 3.

The device depicted in FIG. 4 differs in construction from the device of FIG. 3 as mentioned below. A command register 24CR is provided in which data can be set from the data area 21BD of the instruction memory 21, and a multiplexer 249 is provided which is responsive to a control signal C3 to selectively output either an address based on the outputs of the both X and Y address computation parts 24X and 24Y or the output of the command register 24CR. Moreover, in the control signal area 21BC in the address computation instruction area 21B of the instruction memory 21 there are included a control bit L4 assigned to a control signal L4 for loading a command in the command register 24CR and a control bit S3 assigned to a control signal S3 for specifying the selection of the multiplexer 249. The Y address computation part 24Y is identical in construction with the X address computation part 24X, but the data area 21BD is shared by the X and Y address computation parts 24X and 24Y. Control signals for the Y address computation part 24Y are provided from control bits dedicated to them in the control signal area 21BC as is the case with the X address computation part 24X but they are not shown for the sake of brevity. Since the X and Y address computation parts 24X and 24Y operate in the same manner, the following description will be given of the X address side alone.

In the arrangement shown in FIG. 4 there is initialized in the command register 24CR a command in response to the control signal L4 at the start of the test. Addresses are sequentially generated by logical operation in accordance with address computation instructions described in the address computation instruction area 21B of the instruction memory 21. In the case of switching the mode of operation from the address generation to the command generation in a certain step, the counters 242 and 247 and the arithmetic and logic unit 245 are put in the hold state and the multiplexer 249 is controlled by the control signal S3 from the control signal bit S3 to output the command in the command register 24CR. The mode of operation can be returned to the address generation by putting the counters 242 and 247 and the arithmetic and logic unit 245 out of the hold state and controlling the multiplexer 249 by the control signal S3 to select the output of the multiplexer 248. Thus, the present invention does not call for rewriting the contents of the register 246, the counter 247 and the current register 244 to output the command, and hence allows ease in the preparation of the instruction program and permits switching between the address generation and the command generation without introducing a dummy cycle.

The command register 24CR in FIG. 4 may be substituted with a command memory 24CR wherein there are stored a plurality of commands at different addresses, and in this instance, data from the data area 21BD is provided as a read address to the memory 24CR to read out therefrom a command for input into the multiplexer 249. In such a case, various commands are prestored in the memory 24CR, for example, via a system bus (not shown) immediately before-the test starts. The control signal L4 is applied to a read enable signal to the memory 24CR.

In the case of testing the semiconductor memory M of the type that physical and logical addresses do not necessarily match as referred to previously in conjunction with FIG. 2, the logical address available from the address computation part 24 is translated by the address descrambler 25 to a physical address, but in the case of testing a memory of the type that physical and logical addresses match, the logical address from the address computation part 24 is output intact without being translated by the address descrambler 25. The address descrambler 25 includes, though not shown, a multiplexer which selectively outputs a physical address translated from the logical address from the address computation part 24 and a non-translated version of the logical address, and a descramble enable register which holds a descramble enable signal for controlling the selection of the multiplexer. If the memory under test is the type that calls for the address translation, then the descramble enable signal is set in the descramble enable register via the system bus of the memory tester prior to the test, and the descramble enable signal is used to control the multiplexer to output therethrough a translated address (i.e. a physical address).

Figure 5:
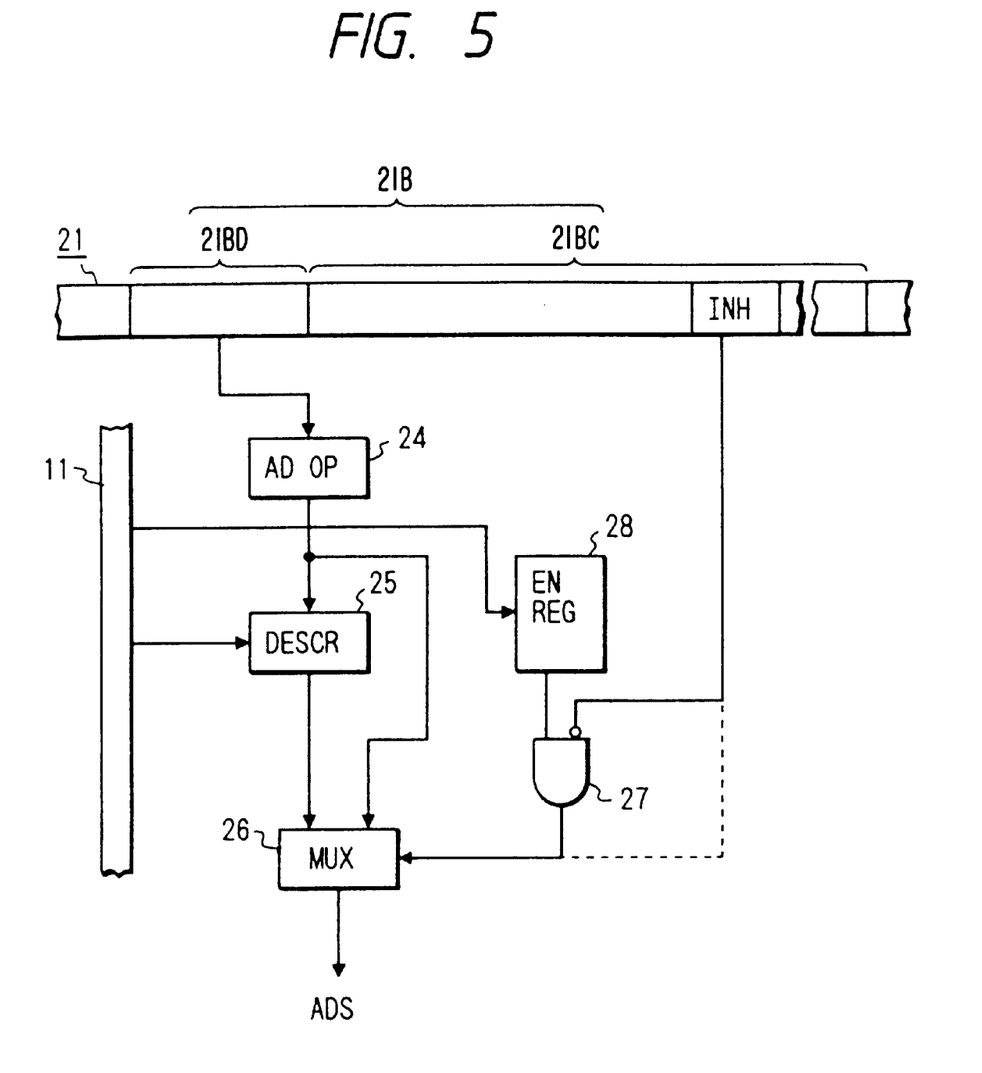
FIG. 5 is a block diagram illustrating another embodiment of the address generating device according to the present invention.

With the address generating device of the present invention depicted in FIG. 4, in the case of testing flash memory wherein one input terminal is used both as an address input terminal and as a command input terminal as mentioned previously, a command which is output from the address computation part 24 is also translated by the address descrambler 25, and consequently, no correct command can be provided to the memory under test M. According one possible method that is considered as a solution to this problem is such as follows: The test is once stopped to erase the descramble enable signal in the descramble enable register via the system bus of the tester to prevent the address translation of the command, and after the command is provided intact to the memory under test the test is stopped again to write the descramble enable signal in the descramble enable register. Another possible method is to determine input data corresponding to a translated output command so that the command from the address computation part 24 becomes a predetermined command after being subjected to the address translation by the descrambler 25, that is, to prestore data of an inversely translated version of the command in the data area 21BD of the instruction memory 21. The former method is impractical, because it involves the suspension of the test. The latter method is disadvantageous in that the inversely translated data must be prepared by an operator for each command to be output. FIG. 5 illustrates an embodiment of the address generating device according to the present invention which is free from such defects of the prior art.

In FIG. 5 the parts corresponding to those in FIG. 2 are identified by the same reference numerals. As in the prior art example of FIG. 2, the output of the address computation part 24 is applied to the descrambler 25. A logical-to-physical-address translation table predetermined according to the type of the memory to be tested is stored in the descrambler 25 prior to the test. In the instruction memory 21 there is provided a descramble inhibit bit INH and its read output is provided to an inverting input terminal of an AND gate 27. The descramble enable register 28 is connected to a system bus 11 of the memory tester, and when the memory under test M is the type calls for the address translation, the descramble enable signal EN (H logic, for example) is stored in the register 28 prior to the test. The output of the AND gate 27 is provided as a select control signal to a multiplexer 26.

In the case where the address computation part 24 generates a command for the memory under test M in a certain step in the course of sequentially generating logical addresses for the memory M in response to instructions in the instruction memory 21, the descramble inhibit signal INH described in the corresponding instruction step is read out of the inhibit bit INH of the instruction memory 21 and is applied to the gate 27 to inhibit the descramble enable signal EN. As the result of this, the multiplexer 26 selects and outputs the output of the address computation part 24, hence the command therefrom at this time is provided directly to the memory under test M. When switching the command generation mode to the address generation mode, the output of the inhibit bit INH goes down to the L logic, enabling the gate 27. Consequently, the logical address from the address computation part 24 is translated by the descrambler 25 to a physical address, which is output via the multiplexer 26.

In the FIG. 5 embodiment the address computation part 24 may be identical in construction with that depicted in FIG. 4. The descramble enable signal EN need not necessarily be stored in the register 28 via the system bus 11 but may also be prestored in the instruction memory 21 so that it is transferred from its data area 21BD to the register 28 at the beginning of the instruction program for conducting the test. It is also possible to employ an arrangement in which the AND gate 27 and the descramble enable register 28 are omitted, the descramble inhibit signal INH or descramble enable signal EN is written in the instruction memory 21 and its read-out signal is used to directly control the multiplexer 26 as indicated by the broken line.

As described above, according to the present invention, the address signal and the control signal can sequentially be applied to the memory under test without introducing a dummy cycle. This enables the memory to be tested under the same conditions as in the actual use.

Moreover, even in the address descramble mode the address descramble can be inhibited by inhibit bit read out of the instruction memory 21 in an arbitrary cycle during the address generation. Consequently, the output from the address generation part 24 can be provided intact without being applied to the descrambler 25, hence the command from the address computation part 24 can be provided to the memory under test without being subjected to the address translation.

It will be apparent that many modifications and variations may be effected without departing from the scope of the novel concepts of the present invention.

What is claimed is:

1. An address generating device in a memory tester for testing a semiconductor memory, comprising:

an instruction memory including a data area for storing address computation data for generating by logical operation addresses provided to said semiconductor memory and mode control data provided to said semiconductor memory, for controlling an operation mode of said semiconductor memory, respectively, and a control signal area for storing load control signals for controlling both loading of said mode control data and loading of said address computation data, operation control signals for controlling the logical operation of said addresses, and a descramble inhibit signal, respectively, said instruction memory storing a program comprising a sequence of instructions, said sequence of instructions comprising said address computation data and said control signals;

sequence control means for controlling the readout sequence of said instruction memory;

an address computation part comprising:

address computation means, connected to said instruction memory, for sequentially generating by logical operation the addresses applied to said semiconductor memory in response to said address computation data and said operation control signals read out of said instruction memory and for outputting the addresses, mode control data storage means, connected to said instruction memory, for storing said mode control data read out of said data area of said instruction memory and applied to said semiconductor memory, and selective output means having two inputs and one output, one of said two inputs being connected to an output of said address computation means, another input thereof being connected to an output of said mode control data storage means, said selective output means selecting one of outputs supplied from said address computation means and said mode control data storage means in response to an operation control signal supplied from said control signal area of said instruction memory and outputting a selected one of outputs to said semiconductor memory;

descramble means, connected to said address computation part, for translating the addresses supplied from said address computation part to respective physical addresses of said semiconductor memory;

multiplexer means having two inputs and one output, one of said two inputs being connected to an output of said descramble means, another input thereof being connected to said address computation part, said multiplexer means selecting one of outputs supplied from said descramble means and multiplexer control means, connected to said instruction memory, for controlling said multiplexer means to select and output the output supplied from the address computation part in response to said descramble inhibit signal read out of said control signal area of said instruction memory and supplied to said multiplexer control means.

2. The device of claim 1, wherein said multiplexer control means includes address descramble enable register means for storing an address descramble enable signal in accordance with a kind of said semiconductor memory and gate means for controlling passage therethrough of said descramble enable signal from said descramble enable register means, and wherein said gate means passes said descramble enable signal therethrough and supplies said descramble enable signal to said multiplexer control means so that said multiplexer means selects and outputs the output supplied from said descramble means when said descramble inhibit signal is not read out of said control signal area of said instruction memory and when said descramble inhibit signal is read out of said control signal area of said instruction memory, said gate means inhibits said descramble enable signal from passing therethrough in response to said descramble inhibit signal so that said multiplexer means selects and outputs the output supplied from said address computation means.

3. An address generating device in a memory tester for testing a semiconductor memory, said address generating device comprising:

an instruction memory including a data area for storing address computation data for generating by logical operation addresses provided to said semiconductor memory and mode control data applied to said semiconductor memory, for controlling an operation mode of said semiconductor memory, respectively, and a control signal area for storing load control signals for controlling both loading of said mode control data signals for controlling both loading of said mode control data and loading of said address computation data, operation control signals for controlling the logical operation of said addresses, and a descramble inhibit signal, respectively, said instruction memory storing a program comprising a sequence of instructions, said sequence of instructions comprising said address computation data and said control signals;

sequence control means for controlling a readout sequence of said instruction memory;

an address computation part comprising:

address computation means, connected to said instruction memory, for sequentially generating by logical operation the addresses applied to said semiconductor memory in response to said address computation data and said operation control signals read out of said instruction memory and for outputting the addresses, mode control data storage means, connected to said instruction memory, for storing said mode control data read out of said data area of said instruction memory and applied to said semiconductor memory, and selective output means having two inputs and one output, one of said two inputs being connected to an output of said address computation means, another input thereof being connected to an output of said mode control data storage means, said selective output means selecting one of outputs supplied from said address computation means and said mode control data storage means in response to an operation control signal supplied from said control signal area of said instruction memory and outputting the selected one output to said semiconductor memory;

descramble means, connected to said address computation part, for translating the addresses supplied from said address computation part to respective physical addresses of said semiconductor memory;

multiplexer means having two inputs and one output, one of said two inputs being connected to the output of said descramble means, the other input thereof being connected to said address computation part, said multiplexer means selecting one of outputs supplied from said descramble means and said address computation part; and multiplexer control means for supplying said descramble inhibit signal from said control signal area of said instruction memory directly to said multiplexer means to control said multiplexer means so that said multiplexer means selects and outputs the output supplied from said address computation part.

* * * * *

UNITED STATES PATENT AND TRADEMARK OFFICE
CERTIFICATE OF CORRECTION

PATENT NO.: 6,019,501
DATED : February 1, 2000
INVENTOR(S): Tadashi OKAZAKI

It is certified that [an/error[s]] appears in the above-identified patent and that said Letters Patent is hereby corrected as shown below:

```
              On the title page : Item
```
[56] References Cited
Patent No. 4,701,919, change "Maitoh et al." to --Naitoh et al.--

Col. 2, line 15, after "address" insert --an--.

Col. 5, line 34, change "high" to --which--.

Col. 5, line 39, change "an" (second occurrence) to --and--.

Signed and Sealed this

Ninth Day of January, 2001

*Attest:*

Q. TODD DICKINSON

*Attesting Officer*     Commissioner of Patents and Trademarks